US006995560B2

(12) United States Patent
Duerk et al.

(10) Patent No.: US 6,995,560 B2
(45) Date of Patent: Feb. 7, 2006

(54) CHEMICAL SPECIES SUPPRESSION FOR MRI IMAGING USING SPIRAL TRAJECTORIES WITH OFF-RESONANCE CORRECTION

(76) Inventors: Jeffrey L. Duerk, 519 Rockwood Ct., Avon Lake, OH (US) 44012; Jonathan S. Lewin, 104 Ridgewood Rd., Baltimore, MD (US) 21210; Hisamoto Moriguchi, 11457 Mayfield Rd. 1257, Cleveland, OH (US) 44106

( * ) Notice: Subject to any disclaimer, the term of this patent is extended or adjusted under 35 U.S.C. 154(b) by 0 days.

(21) Appl. No.: 10/805,841

(22) Filed: Mar. 22, 2004

(65) Prior Publication Data
US 2005/0017717 A1 Jan. 27, 2005

Related U.S. Application Data

(60) Provisional application No. 60/456,333, filed on Mar. 20, 2003.

(51) Int. Cl.
 *G01V 3/00* (2006.01)
(52) U.S. Cl. ...................... 324/310; 324/309; 324/307; 324/306
(58) Field of Classification Search ................ 324/303, 324/306, 307, 309, 318–322; 600/410, 407
See application file for complete search history.

(56) References Cited

U.S. PATENT DOCUMENTS

| | | | | |
|---|---|---|---|---|
| 5,270,653 A | * | 12/1993 | Pauly | ........................... 324/309 |
| 5,402,067 A | * | 3/1995 | Pauly et al. | ................. 324/307 |
| 5,498,960 A | * | 3/1996 | Vinegar et al. | ............. 324/303 |
| 6,016,057 A | * | 1/2000 | Ma | ............................. 324/309 |
| 6,020,739 A | * | 2/2000 | Meyer et al. | ................ 324/309 |
| 6,084,408 A | * | 7/2000 | Chen et al. | .................. 324/303 |
| 6,215,306 B1 | * | 4/2001 | Tsai et al. | .................... 324/309 |
| 6,459,922 B1 | * | 10/2002 | Zhang | ......................... 600/410 |
| 6,486,670 B2 | * | 11/2002 | Heid | .......................... 324/307 |
| 6,583,623 B1 | * | 6/2003 | Kwok et al. | ................. 324/307 |
| 6,603,990 B2 | * | 8/2003 | Zhang et al. | ............... 600/410 |
| 2001/0026157 A1 | * | 10/2001 | Heid | .......................... 324/312 |
| 2003/0060697 A1 | * | 3/2003 | Zhang et al. | ............... 600/410 |
| 2005/0017717 A1 | * | 1/2005 | Duerk et al. | ................. 324/307 |
| 2005/0033153 A1 | * | 2/2005 | Moriguchi et al. | ......... 600/410 |

FOREIGN PATENT DOCUMENTS

| | | | |
|---|---|---|---|
| EP | 0950902 | * | 10/1999 |
| WO | WO 2004086060 A2 | * | 10/2004 |
| WO | WO 2004097387 A2 | * | 11/2004 |

OTHER PUBLICATIONS

Kwok et al., article: "Interleaved Water and Fat Dual-Echo Spin Echo Imaging with Intrinsic Chemical-Shift Elimination", Journal of Magnetic Resonance Imaging 13: 318-323 (2001).*

(Continued)

*Primary Examiner*—Brij Shrivastav
*Assistant Examiner*—Tiffany A. Fetzner
(74) *Attorney, Agent, or Firm*—Hahn Loeser + Parks LLP

(57) ABSTRACT

A method of chemical species suppression for MRI imaging of a scanned object region including acquiring K space data at a first TE, acquiring K space data at a second TE, reconstructing images having off resonance effects, estimating off resonance effects at locations throughout the reconstructed image, and determining the first and second chemical species signals at image locations of the scanned object from the acquired signals and correcting for blurring resulting from off resonance effects due to $B_0$ inhomogeneity.

26 Claims, 6 Drawing Sheets

OTHER PUBLICATIONS

Nayak K. S. et al: "Efficient off-resonance correction for spiral imaging" (Magnetic Resonance in Medicine Wiley USA, vol 45, No. 3, 2001, pp. 521-524).*

Noll D. C. et al: "Deblurring for Non-2D Fourier Transform Magnetic Reasonace Imaging" 1-2,☐☐5,6, 8-20 (Magnetic Resonance in Medicine 25, (1992).*

King K.F. et al., Concomitant gradient field effects in spiral scans'Magnetic Resonance in Medicine: Official Journal of the Society of Magnetic Resonance in Medicine/society of Magnetic Resonance in Medicine. Jan 1999. vol. 41, no 1. pp. 103-112.*

Irarrazabal P. et al.: "Inhornogeneity Correction Using An Estimated Linear Field Map"☐☐Magnetic Resonance in Medlcine, Academic Press, Duluth, MN, US, vol. 35, No. 2, Feb. 1, 1996. pp. 278-282.*

Man L-C et al "Multifrequency Interpolation for Fast Off-Resonance Correction" Magnetic Resonance in Medicine, Academic Press, Duluth, MN, US, vol. 37. No. 5. May 1, 1997 pp. 785-792.*

Glover. G. H. et al.: "Three-point Dixon Technique for True Water/Fat Decomposition with B0 Inhomogeneity Correction" (Magnetic Resonance in Medicine, Academic Press, Duluth, MN. US. vol. 18. No. 2. Apr. 1, 1991 pp. 371-383.*

Craig H. Meyer, Bob S. Hu, Dwight G. Nishimura, Albert Macovski, "Fast Sprial Coronary Artery Imaging," Magnetic Resonance in Medicine 28, Academic Press, Inc., pp. 202-213, (1992).

* cited by examiner

CHEMICAL SPECIES SUPPRESSION FOR MRI IMAGING USING SPIRAL TRAJECTORIES WITH OFF-RESONANCE CORRECTION

CROSS REFERENCE TO PRIORITY APPLICATION

This application (U.S. patent application Ser. No. 10/805,841 filed on Mar. 22$^{nd}$ 2004, and published on Jan. 27$^{th}$ 2005 as U.S. Patent Application Publication 2005/0017717 A1; which corresponds to International application number PCT/US2004/008636 with an International Publication number of WO 2004/086060 A2 published on Oct. 7$^{th}$ 2004) and its associated US and international publications claim(s) priority to U.S. provisional Ser. No. 60/456,333 filed Mar. 20$^{th}$ 2003, which is incorporated herein by reference in its entirety.

CROSS REFERENCE TO RELATED CO-PENDING APPLICATION/PUBLICATION

This application is related to later-filed copending U.S. patent application Ser. No. 10/832,659 filed on Apr. 26$^{th}$ 2004, published on Feb. 10$^{th}$ 2005 as U.S. Patent Application Publication 2005/033153 A1, which corresponds to International application number PCT/US2004/012858 with an International Publication number of WO 2004/097387 A2 published on Nov. 11$^{th}$ 2004; the related U.S. application Ser. No. 10/832,659, its publication as US 2005/033153 A1, and the international publication of WO 2004/097387 A2 have priority drawn from the U.S. provisional application No. 60/465,551 filed on Apr. 25$^{th}$ 2003. These applications/publications have the same inventive entity as the current application and correspond to one another.

BACKGROUND OF THE INVENTION

The present invention relates to a method of fat suppression in MRI imaging and more particularly to a method of fat suppression using Dixon techniques with spiral trajectories.

Off-resonance effects (e.g., field inhomogeneity, susceptibility, chemical shift) cause artifacts in magnetic resonance imaging (MRI). The artifacts appear as positional shifts along the readout direction in rectilinearly sampled acquisitions. Usually, they are insignificant, because of short readout, times, in normal spin echo (SE) and gradient echo (GRE) sequences. However, off-resonance artifacts sometimes appear as severe geometric distortion because of the relatively long readout time in echo planar imaging (EPI).

Over the past decade, spiral imaging techniques have gained in popularity due to their short scan time and insensitivity to flow artifacts. However, off-resonance effects (e.g., ~3.5 ppm shift between fat and water protons) cause blurring artifacts in the reconstructed image. Most spiral off-resonance correction methods proposed to date are difficult to apply to correct for blurring artifacts due to the fat signals since the fat-water shift is typically much greater than that due to B0 inhomogeneities across the field of view (FOV). As such, off resonance artifacts remain one of the main disadvantages of spiral imaging.

Currently, off-resonance artifacts are most commonly avoided by use of spatially and spectrally selective radio-frequency (RF) excitation pulses (SPSP pulses) since they excite only water spins, thereby eliminating the off-resonance fat signal and hence avoid artifact generation. Yet, SPSP pulses usually take a significant fraction of the TR of a spiral sequence, particularly when a sharp transition band is designed between two chemical shift frequencies. The time duration of SPSP pulses is sometimes even equivalent to the spiral readout duration. This can be considered as one of the current limitations to reducing scan time in spiral imaging, and thus, alternative approaches to fat-water separation in spiral imaging are required.

Excitation of only water spins could be achieved through application of chemical shift presaturation pulses (e.g., CHESS pulses) prior to normal spatially selective excitation. However, the effectiveness of these frequency selective RF excitation pulses is dependent on the main magnetic field ($B_0$) inhomogeneity.

Alternatively, Dixon techniques have primarily been investigated for water-fat decomposition in rectilinear sampling schemes. In the original Dixon technique, water and fat images were generated by either addition or subtraction of the "in-phase" and "out-of-phase" data sets. Water and fat separation is unequivocal using this technique when magnetic field inhomogeneity is negligible over the scanned object. However, when $B_0$ inhomogeneity cannot be neglected, the original Dixon technique fails to accurately decompose water and fat signals. Therefore, modified Dixon techniques using three data sets (i.e., three-point Dixon (3PD) technique) or four data sets were developed to correct for $B_0$ inhomogeneity off-resonance effects and microscopic susceptibility dephasing. New versions of the Dixon technique use two data sets with $B_0$ inhomogeneity off-resonance correction (i.e., two-point Dixon (2PD) technique). The water-fat decomposition performance is almost equivalent to that of the 3PD technique although off-resonance frequency estimation of this technique would be unstable for voxels with nearly equal water and fat signal intensities. The advantage of these multiple-point Dixon techniques over spectrally excited RF pulses is that water-fat separation can be achieved even in the presence of $B_0$ inhomogeneity. This advantage is of notable importance because neither tissue-induced local magnetic field inhomogeneity nor external applied magnetic field inhomogeneity can be completely removed by shimming.

BRIEF DESCRIPTION OF THE DRAWINGS

The invention may take form in certain components and structures, preferred embodiments of which will be illustrated in the accompanying drawings wherein.

DETAILED DESCRIPTION OF THE INVENTION

It is to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting.

The long readout time of spiral trajectories leads to off-resonance signals that blur into neighboring pixels; spins from multiple off-resonance frequencies can all contribute to the voxel signal. However, it can generally be assumed that Bo inhomogeneity is smoothly varying across the FOV (this assumption will be referred to as 'assumption(i)'). Thus, the average off-resonance frequency in any pixel is usually close to the true local Bo field strength. This concept is exploited in the conventional method to create an off-resonance frequency map in spiral imaging, in which the phase difference is taken between two images (with different TE's) even though both images are already blurred by off-resonance effects.

Spiral 3PD Technique

Figure 1:
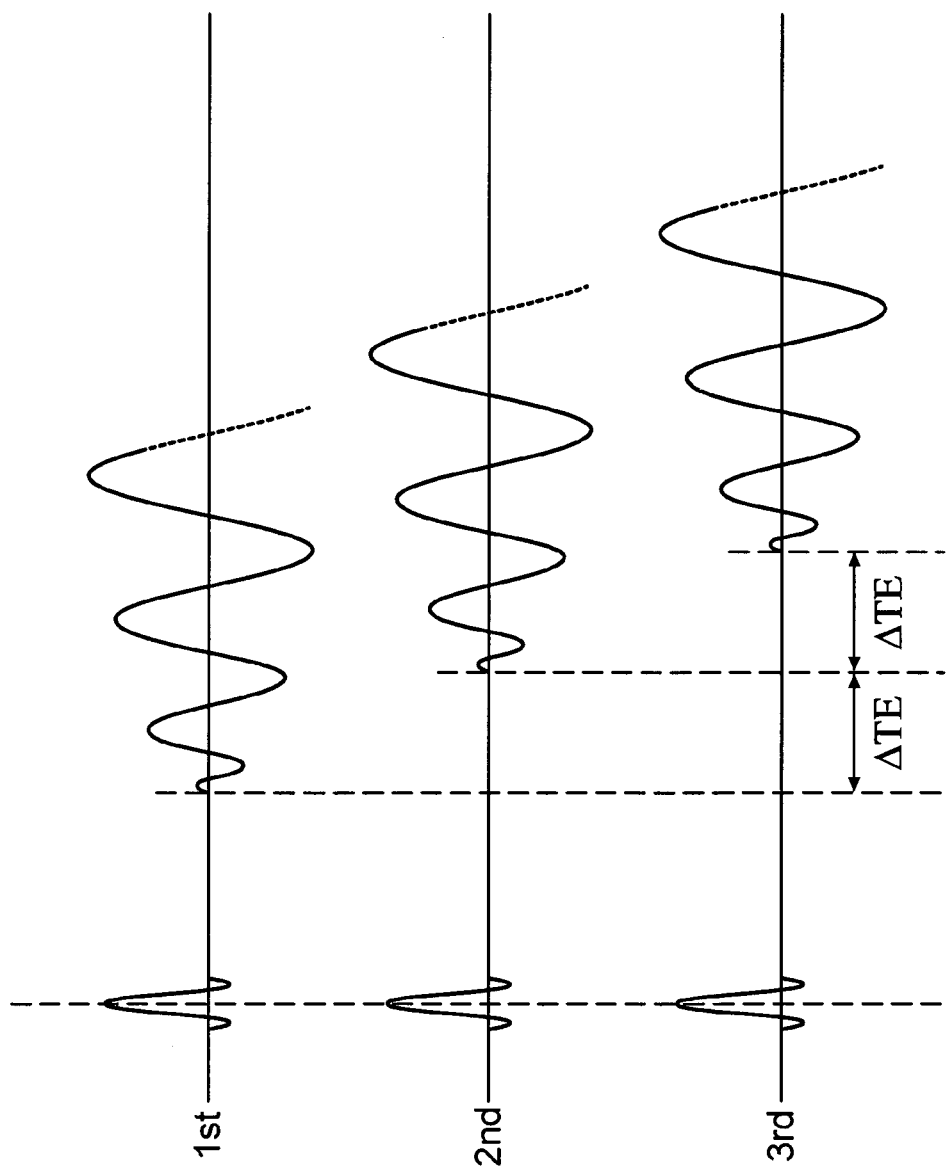
FIG. 1. is a simplified sequence diagram of the spiral three-point Dixon (spiral 3PD) technique.

Suppose that three k-space data sets with TE differences ($\Delta TE$ (s)) are acquired using a normal spatially selective RF pulse for each TR (FIG. 1). As shown, the TE difference between the first and the second acquisitions and that between the second and the third acquisitions are set to equal ($\Delta TE$).

The signals at each pixel in the reconstructed images ($S_0$, $S_1$ and $S_2$) from these data sets can be expressed as:

$$S_0 = W' + F' \quad [1]$$

$$S_1 = (W' + F' \exp(i\phi_{fat}))\exp(i\phi) \quad [2]$$

$$S_2 = (W' + F' \exp(i2\phi_{fat}))\exp(i2\phi) \quad [3]$$

where W' represent water signals blurred by local $B_0$ inhomogeneity off-resonance frequency f(Hz), F' are fat signals blurred by local $B_0$ inhomogeneity and chemical-shift off-resonance frequencies $f+f_{fat}$ (Hz), and $\phi$ and $\phi_{fat}$ are the phase shifts due to $B_0$ inhomogeneity and chemical-shift off-resonance effects during $\Delta TE$. That is, $$\phi = 2\pi f \Delta TE, \quad [4]$$

$$\phi_{fat} = 2\pi f_{fat} \Delta TE. \quad [5]$$

respectively.

A quadratic equation with respect to $\exp(i\phi)$ can be derived from Eqs. [1–3] to provide an estimate of the frequency field map:

$$\exp(i\phi) = \frac{S_1(\exp(i\phi_{fat}) + 1) \pm \sqrt{S_1^2(\exp(i\phi_{fat}) + 1)^2 - 4S_0 S_2 \exp(i\phi_{fat})}}{2S_0 \exp(i\phi_{fat})} \quad [6]$$

In practice, it is difficult to select one appropriate root from the two roots given by Eq. [6]. Moreover, at the pixels where image SNR is low, both roots of Eq. [6] may be inaccurate.

Alternatively, several different predetermined frequencies $f_j$ (Hz) for a sufficiently wide frequency range are substituted into Eqs. [1–3], and W' and F' are solved for each frequency $f_j$. The calculated W' and F' (Eqs. [7, 8]) are compared with the observed signals, $S_0$, $S_1$ and $S_2$. The objective is to find the $f_j$ that provides the best fit of calculated W' and F' to the observed signals. Given a frequency $f_j$, W' and F' can be solved from any two equations of Eqs. [1–3]. To make signal contributions from $S_0$, $S_1$ and $S_2$ equal to the calculated W' and F', they are computed as follows:

$$\overline{F}'_j = \frac{1}{3}(F'_{01,j} + F'_{12,j} + F'_{20,j}) \quad [7]$$

$$\overline{W}'_j = \frac{S_0 + S_1 + S_2 - \overline{F}'_j(1 + \exp(i\phi_j + \phi_{fat})) + \exp(i2(\phi_j + \phi_{fat})))}{1 + \exp(i\phi_j) + \exp(i2\phi_j)} \quad [8]$$

where $$F'_{01,j} = \frac{\exp(i2\phi_j)S_0 - \exp(i\phi_j)S_1}{\exp(i2\phi_j)(1 - \exp(i\phi_{fat}))}, \quad \text{(F' derived from Eqs. [1, 2])}$$

$$F'_{12,j} = \frac{\exp(i\phi_j)S_1 - S_2}{\exp(i2\phi_j)\exp(i\phi_{fat})}, \quad \text{(F' derived from Eqs. [2, 3])}$$

$$F'_{20,j} = \frac{(1 - \exp(i\phi_{fat}))\exp(i2\phi_j)S_0 - S_2}{\exp(i2\phi_j)(1 - \exp(i2\phi_{fat}))}, \quad \text{(F' derived from Eqs. [3, 1])}$$

$\phi_j = 2\pi f_j \cdot \Delta TE$.

At each pixel, variation between the observed and calculated signals, $D_{pixel}$ (Eq. [9]) will be minimized at j=l if the frequency $f_l$ is the closest to the actual $B_0$ inhomogeneity off-resonance frequency out of all the test frequencies $f_j$.

$$D_{pixel} = |S_0 - (\overline{W}'_j + \overline{F}'_j)| + |S_1 - (\overline{W}'_j + \overline{F}'_j \exp(i\phi_{fat}))\exp(i\phi_j)| + |S_2 - (\overline{W}'_j + \overline{F}'_j \exp(i2\phi_{fat}))\exp(i2\phi_j)| \quad [9]$$

In practice, $D_{pixel}$ may not take the minimum value when j=l at those pixels where image SNR is low. To reduce the errors from noise, a small multi-pixel window is set about each location and the summation of $D_{pixel}$ within the window is measured:

$$D_{local} = \sum_{window} D_{pixel} \quad [10]$$

Figure 2:
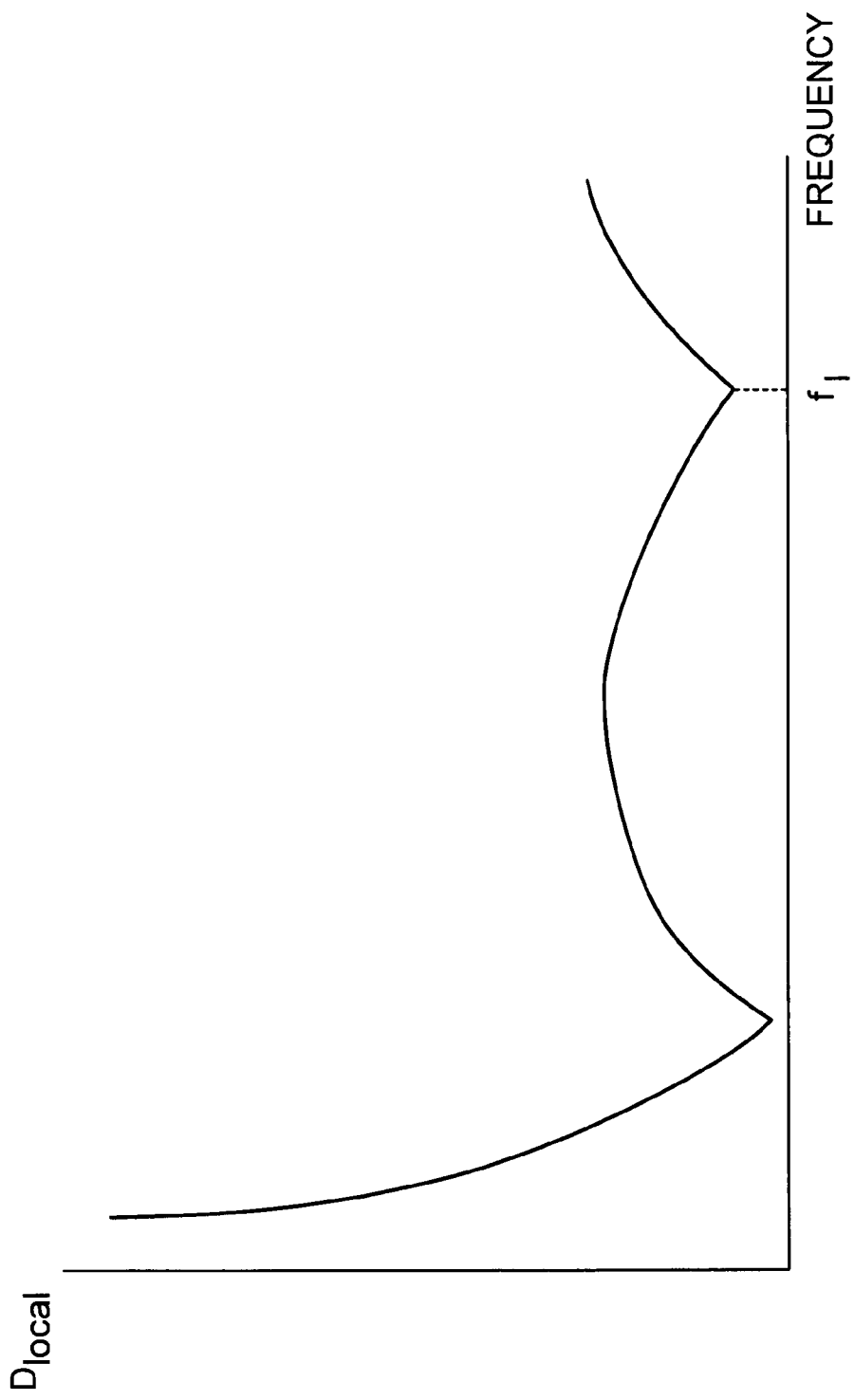
FIG. 2. illustrates an example of $D_{local}$-$f_j$ plots that have two local minima.

Even if noise effects are completely eliminated, a plot of $D_{local}$ with respect to $f_j$ sometimes takes two local minima as shown in FIG. 2. This can be understood since Eq. [6] gives two roots. Since both roots in Eq. [6] satisfy Eqs. [1–3], $D_{local}$ may not be the actual local field strength. To select a correct frequency $f_l$, a region growing algorithm is applied. The region growing algorithm was originally proposed as a phase unwrapping algorithm. In our method, the initial frequency map for the region growing algorithm can be determined as the value of $f_j$ that minimizes $D_{local}$ where $D_{local}$ takes the single minimum in the $D_{local}$-$f_j$ plot. This defines a 'frequency determined' region.

Alternatively, a specific $\Delta TE$ can be chosen for simplification. The TE of the first data set will be an integer multiple of $\Delta TE$. For example, a $\Delta TE=2.2$ ms for 1.5 T can be chosen and:

$$S_1 = (W' - F')\exp(i\phi)$$

$$S_2 = (W' + F')\exp(i2\phi)$$

$$S_2/S_0 = \exp(i2\phi)$$

Figure 3:
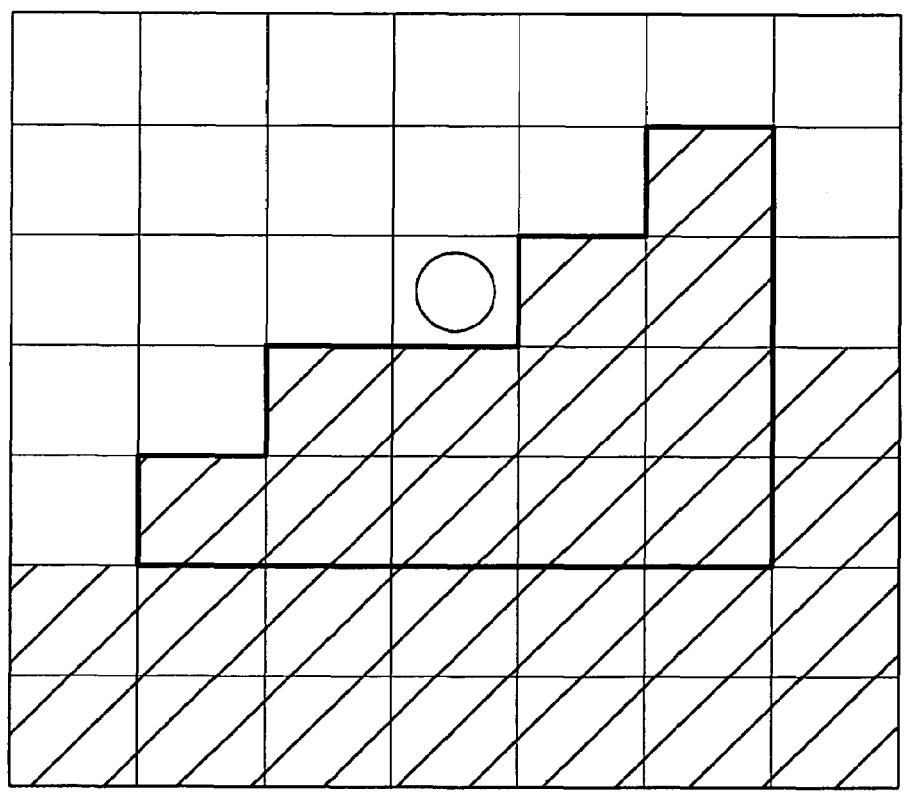
FIG. 3. illustrates a selection process of the correct local off-resonance frequency using a region growing algorithm.

The second step is to find the correct frequency $f_l$ at each pixel in a 'frequency to-be-determined region' which abuts the 'frequency determined' region found in previous steps. FIG. 3 illustrates the process used to select a correct local frequency $f_l$. The shadowed region denotes the 'frequency determined' region. At each pixel that borders on the shadowed region, the value of $f_j$ chosen is that which creates a local minima in the $D_{local}$-$f_j$ plot, and, is the closest to the average local frequency of the neighboring pixels in the frequency determined region. In FIG. 3, suppose that the frequency of the pixel with a circle inside is to be determined and that $D_{local}$ of this pixel takes more than one local minima. The value of $f_j$ at which $D_{local}$ takes local minima and is the closest to the average local value in the nearby frequency determined region is selected as $f_l$ for the pixel. The frequency determined region is thereby expanded so that the frequency field map can be created for the entire scanned object region.

After the frequency field map is obtained, the deblurred water and fat images W and F are reconstructed based on the frequencies indicated in the frequency field map at each pixel location. Specifically, the water and fat images decomposed with the frequency $f_l$, i.e., $\overline{W}'_l$ and $\overline{F}'_l$ derived from Eqs. [7, 8], are demodulated with demodulation frequencies $f_l$ and $f_l + f_{fat}$ to create the locally deblurred images $W_l$ and $F_l$, respectively. The entirely deblurred water image W can be reconstructed by combining the deblurred regions of water images $W_l$ from each local frequency, $f_l$, in the frequency field map. The entirely deblurred fat image F can be reconstructed in a similar fashion.

To simplify the method described above, $\Delta TE$ can be chosen as $\tau$, the time during which fat spins precess by 180° out of phase with respect to water spins. This condition provides for a more efficient determination of the frequency map, With this condition, the signals at each pixel in the reconstructed images ($S_0$, $S_1$ and $S_2$) from these data sets can be expressed as:

$$S_0 = W' + F' \quad [1a]$$

$$S_1 = (W' - F')\exp(i\phi) \quad [2a]$$

$$S_2 = (W' + F')\exp(i2\phi) \quad [3a]$$

where W' represent water signals blurred by local $B_0$ inhomogeneity off-resonance frequency f(Hz), F' are fat signals blurred by local $B_0$ inhomogeneity and chemical-shift off-resonance frequencies $f + f_{fat}$ (Hz), and $\phi$ is the phase shift due to $B_0$ inhomogeneity off-resonance effects during $\Delta TE$. (The term $f_{fat}$ can also be referred to as $f_{shift}$ or $f_s$ for chemical species other than fat) That is:

$$\phi = 2\pi f \cdot \Delta TE = 2\pi f \tau. \quad [4a]$$

Local off-resonance frequencies are determined. $2\phi$ is obtained as:

$$2\phi = \text{Arg}(S_2/S_0). \quad [5a]$$

Even though signals blur into neighboring voxels due to the local off-resonance effects in the spiral image, from assumption (i), $2\phi$ in Eq. [5a] gives the phase shift due to the true local $B_0$ inhomogeneity off-resonance frequency f at each pixel. Phase unwrapping is then performed to obtain the correct $\phi$ at each pixel using the region growing method with a manually selected seed point as described above. f can be successively determined from Eq. [4a].

Water-fat signal decomposition is performed at each pixel based on the determined frequency map. From Eqs. [1a–3a], one obtains:

$$W' = ((S_0 + S_2 \exp(-i2\phi))/2 + S_1 \exp(-i\phi))/2, \quad [6]$$

$$F' = ((S_0 + S_2 \exp(-i2\phi))/2 - S_1 \exp(-i\phi))/2. \quad [7]$$

De-blurring needs to be performed on the W' and F' images. This is achieved through the use of the frequency-segmented off-resonance correction method. This method reconstructs several images using different demodulation frequencies and selects the most de-blurred region from the stack of reconstructed images under the guidance of a frequency map. The demodulation frequencies used to de-blur W' are those given by the frequency map. The demodulation frequencies used to de-blur F' are the sum of the chemical-shift off-resonance frequency and the local frequencies given by the frequency map. The use of multiple demodulation frequencies enables de-blurred water and fat images, W and F to be reconstructed.

Spiral 2PD Technique

Although the spiral 3PD technique can achieve water-fat separation with off-resonance deblurring, the scan time is prolonged since three data sets are acquired. Here, a newly developed 2PD technique for spiral trajectories is described.

Figure 4:
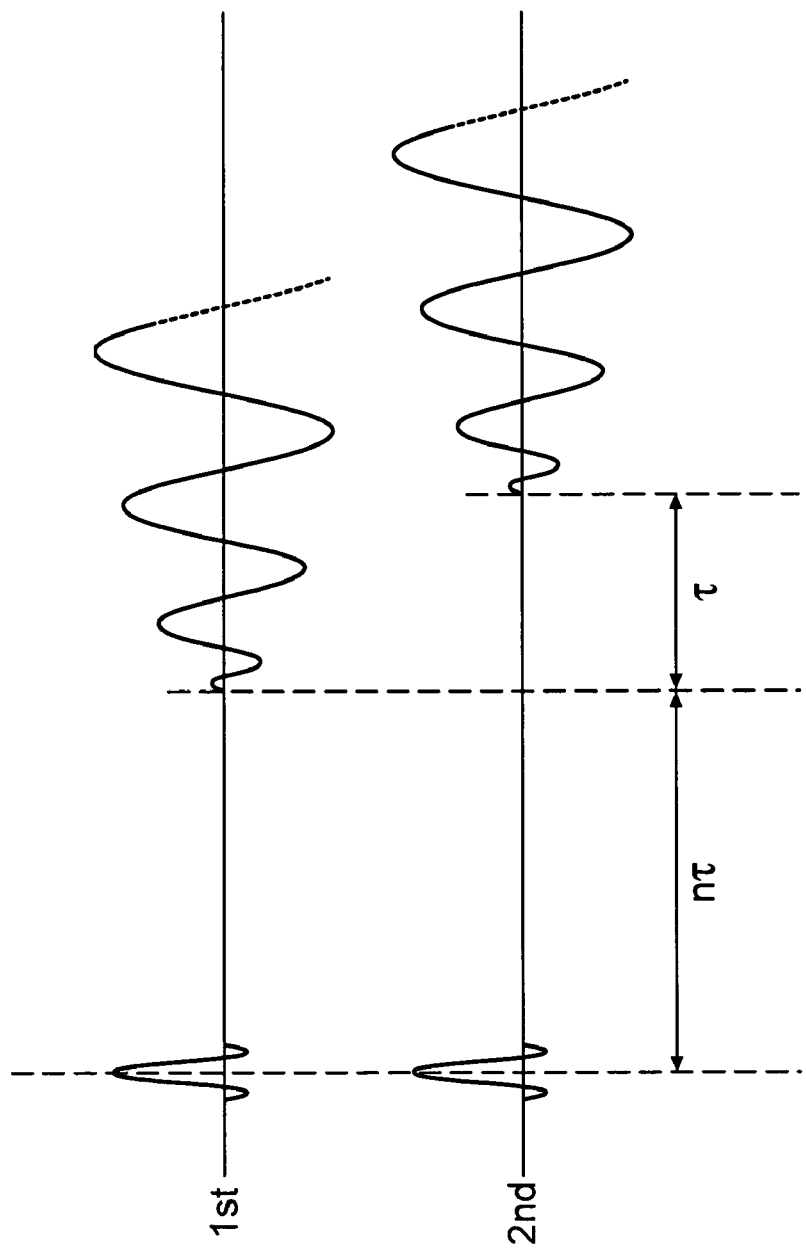
FIG. 4. is a simplified sequence diagram of the spiral two-point Dixon (spiral 2PD) technique.

In the spiral 2PD technique, as shown in FIG. 4, the TE's of the first and second data acquisitions are $n\tau$ and $(n+1)\tau$, respectively, where n is a positive integer and $\tau$ is the time during which fat spins precess by 180° out of phase with respect to water spins.

The signals at each pixel in the reconstructed images ($S_0$ and $S_1$) from these data sets can be expressed as:

$$S_0 = W' + F', \quad [11]$$

$$S_1 = (W' - F')\exp(i\phi), \quad [12]$$

where the definitions of W' and F' are the same as in the spiral 3PD technique, and $\phi$ is the phase shift due to $B_0$ inhomogeneity off-resonance frequency f(Hz) during $\tau$(s). That is, $$\phi = 2\pi f \tau. \quad [13]$$

Eq. [12] can be obtained by simply substituting $\exp(i\phi_{fat}) = -1$ in Eq. [2].

Figure 5A:
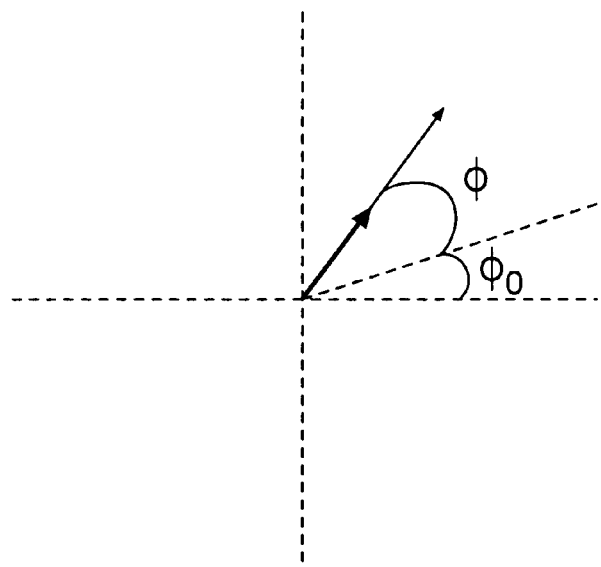
FIG. 5. illustrates water and fat magnetization vectors in the transverse plane at the onset of the spiral gradient in the spiral 2PD technique.
Figure 5B:
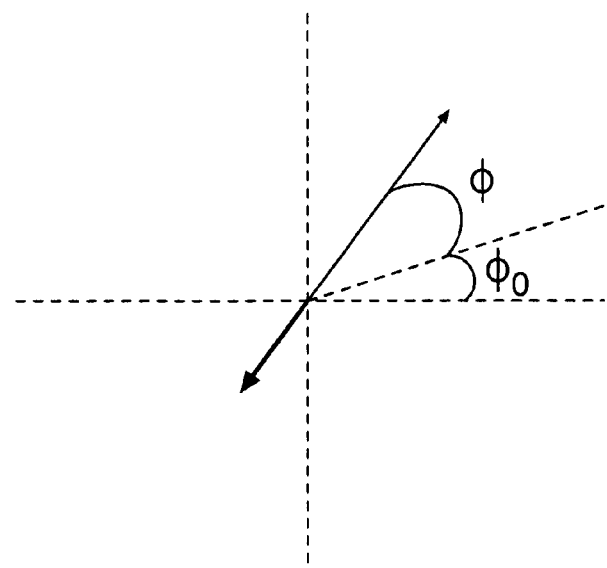

Since it can be assumed that an RF pulse tip angle into the transverse plane is the same for both water and fat spins in each voxel, water and fat magnetization vectors in the transverse plane should be aligned with each other at the onset of the spiral gradient when TE is an even-integer multiple of $\tau$ and they are in the opposed phase when TE is an odd-integer multiple of $\tau$ (FIG. 5). In other words, if W' and F' are deblurred by k-space data demodulation with the correct local off-resonance frequencies (the water and fat images obtained this way are defined as W and F, respectively), the orientation of the two vectors W and F will be identical when TE is an even-integer multiple of $\tau$, and they will be opposite when TE is an odd-integer multiple of $\tau$.

In FIG. 5, the long and short arrows represent the water and fat magnetization vectors, respectively. $\phi_0$ is the RF penetration angle. $\phi$ is the precession angle for the water magnetization during TE. (a) When TE is an even-integer multiple of $\tau$, the water and fat magnetization vectors are aligned with each other at the onset of the spiral. (b) When TE is an odd-integer multiple of $\tau$, the water and fat magnetization vectors are in the opposed phase at the onset of the spiral.

For water-fat signal decomposition, as was done in the spiral 3PD technique, several predetermined demodulation frequencies $f_j$ (Hz) are substituted into Eqs. [11,12]. W' and F' are solved for each demodulation frequency $f_j$ (defined as $W_j'$ and $F_j'$, respectively.):

$$W_j' = \frac{S_0 \exp(i\phi_j) + S_1}{2\exp(i\phi_j)},\quad [14]$$

$$F_j' = \frac{S_0 \exp(i\phi_j) - S_1}{2\exp(i\phi_j)},\quad [15]$$

where $\phi_j = 2\pi f_j \cdot \tau$.

The deblurred water and fat images $W_j$ and $F_j$ can be obtained after k-space data demodulation with the demodulation frequencies $f_j$ and $f_j + f_{fat}$ for $W_j'$ and $F_j'$, respectively. To determine the correct $B_0$ inhomogeneity off-resonance frequency at each pixel, the orientations of two vectors $W_j$ and $F_j$ are compared. When n is even (odd), the value of $f_j$ that makes two vectors $W_j$ and $F_j$ aligned (opposed) to each other is selected as the correct local off-resonance frequency (the correct frequency is defined as $f_l$). As is evident, this process of local off-resonance frequency determination simultaneously reconstructs the final deblurred water and fat images, W and F.

In practice, since some voxels contain predominantly either only water or fat spins, the vector alignment property described above is difficult to use. Hence, the following quantity is measured:

$$\Phi_j = 2 \cdot \text{Arg}\left(\frac{W_j + F_j}{W_j - F_j}\right) \quad [16]$$

The absolute value of this quantity is minimized when the two vectors $W_j$ and $F_j$ are aligned/opposed or when either $W_j$ or $F_j$ predominantly exists. The similar concept was taken advantage of in an earlier rectilinear 2PD technique.

As explained in the spiral 3PD technique, it is difficult to determine the correct frequency in image regions with low SNR. This is also true with the spiral 2PD technique. Therefore, in our algorithm, we first select the pixels of which the absolute values of $\Phi_j$ do not take sufficiently small values at any j. It is considered that the SNR of these pixels are low. Their frequencies are not evaluated in the following algorithm but are interpolated afterward based on the determined frequencies in their vicinity.

After the 'frequencies to be evaluated' regions are determined, a similar algorithm to the spiral 3PD technique is used to reduce the errors in frequency evaluation: The summation of $\exp(i\Phi_j)$ within a small window centered on each pixel is measured and the real part of this quantity is extracted:

$$P_{local} = \text{Re}\left(\sum_{window} \exp(i\Phi_j)\right) \quad [17]$$

Note that the summation in Eq. [17] is a complex sum. $P_{local}$ is expected to be maximized when j=l. However, since $\Phi_j$ often shows periodic-like patterns with j, even in the sufficiently high SNR regions, a plot of $P_{local}$-$f_j$ often has more than one peak with their magnitudes close to one another. In our algorithm, all the values of $f_j$ at which $P_{local}$ takes local maxima in the $P_{local}$-$f_j$ plot, are first chosen at every pixel (these $f_j$ are defined as $f_p$). Then the region growing algorithm is performed to select the correct frequency $f_l$ in a manner similar to the spiral 3PD technique. In other words, of all the values of $f_p$, the one selected is that which is the closest to the average local frequency of the neighboring pixels in the frequency determined region. Unlike the spiral 3PD technique, the region growing algorithm starts with a manually selected single seed point in the spiral 2PD technique.

Algorithms for 2PD and 3PD Techniques with Multi-Coil Data Sets

Multi-element surface coils are often used to obtain images with higher SNR than would be achieved with a single larger coil. Each surface coil usually has a small region of signal sensitivity. Thus the image reconstructed from each set of individual coil data, shows non-uniform signal intensity over an FOV. The $B_0$ inhomogeneity frequency map derived from an individual coil may not be accurate for the region where the image SNR is low. This subsection describes how to apply the 3PD and 2PD spiral reconstruction algorithms described previously when data are acquired from multi-element surface coils. $D_{local}$ in Eq. [10] is redefined as $$D_{local} = \sum_{m}^{n} D_{local} c_m \quad [18]$$

to extend the spiral 3PD algorithm from a single data set to one for multi-coil acquisitions. Here, n is the total number of coils and $D_{local} c_m$ is $D_{local}$ defined in Eq. [10] of the m-th coil data. The frequency field map can be determined by applying the same algorithm described in the previous subsection of the spiral 3PD technique using $D_{local}$ as defined in Eq. [18].

For the spiral 2PD technique, at each demodulation frequency $f_j$, the quantity expressed as Eq. [16] is calculated for each coil data. They are combined at each pixel, weighted by the signal intensities of the reconstructed images. Hence, $\Phi_j$ is redefined as:

$$\Phi_j = \text{Arg}\left(\sum_{m}^{n} (|W_j c_m| + |F_j c_m|) \cdot \exp\left(i \cdot 2\text{Arg}\left(\frac{W_j c_m + F_j c_m}{W_j c_m - F_j c_m}\right)\right)\right) \quad [19]$$

where n is the total number of coils, $W_j c_m$ and $F_j c_m$ are the water and fat images reconstructed from the m-th coil data with the predetermined demodulation frequency $f_j$. $P_{local}$ is computed from $\Phi_j$ defined in Eq. [19] using the same algorithm as explained in the previous section of the spiral 2PD technique. The method to determine the frequency field map from the newly defined $P_{local}$ is also the same.

One-Acquisition Spiral Dixon Techniques Using Variable Density Spiral Trajectories Ideally, only one acquisition would be needed for fat/water decomposition. An efficient spiral off-resonance correction method with only one acquisition has been proposed by Nayak et al. This method is called 'off-resonance correction using variable density spirals (ORC-VDS)'. In this method, odd- and even-numbered spiral interleaves have slightly different TE's and the central portion of k-space is over-sampled using variable density spiral trajectories. A $B_0$ inhomogeneity field map can be calculated by taking the phase difference between the two low-resolution images reconstructed from the data of odd- and even-numbered spiral interleaves.

The extensions of this method to the spiral 3PD and 2PD techniques of the present invention, with reference to FIG. 6, shows the spiral trajectories that over sample the inner regions of k-space with three times (a) and twice (b) higher sampling densities than the outer parts.

Figure 6A:
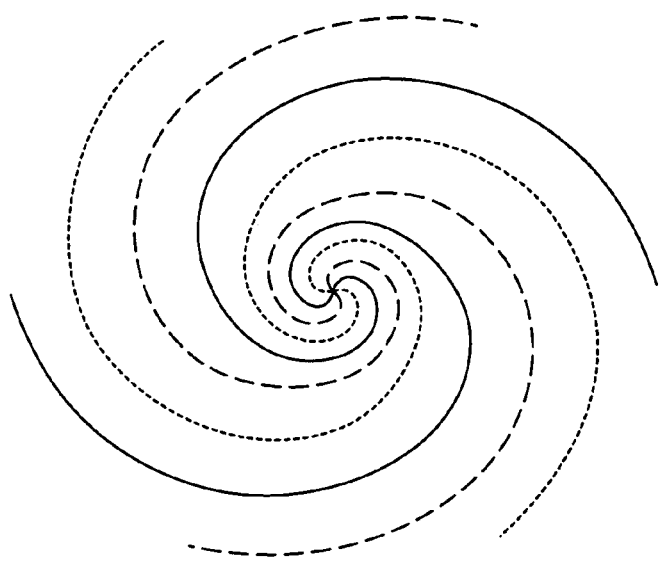
FIG. 6. illustrates variable density spiral (VDS) trajectories for Dixon techniques with one acquisition.
Figure 6B:
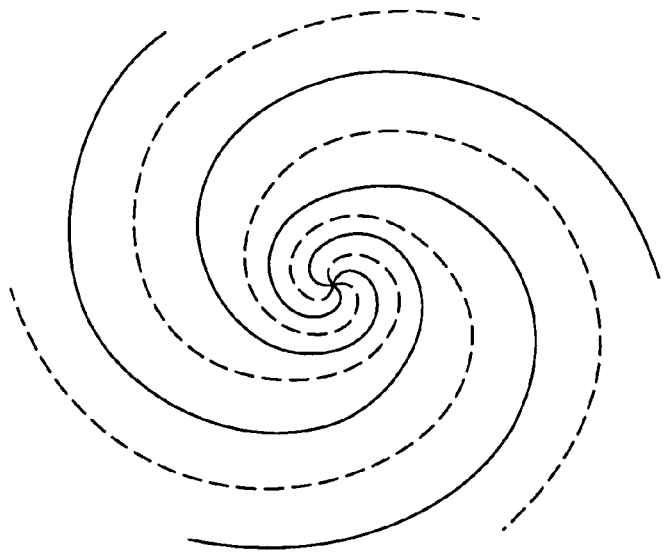

In FIG. 6a, the solid, dashed, and dotted spiral trajectories have three different TE's with their TE differences constant. In FIG. 6b, the solid and dashed spiral trajectories have different TE's with their TE difference equal to $\tau$. In both cases, off-resonance frequency field maps can be derived from the low spatial frequency data using the same algorithms as the spiral 3PD and 2PD techniques described above. It can be expected that these spiral acquisition schemes make it possible to perform the algorithms of spiral 3PD and 2PD techniques with only one acquisition. The Dixon techniques taking advantage of the sampling schemes shown in FIGS. 6a and b will be referred to as 'variable density spiral 3PD (VDS-3PD) technique' and 'variable density spiral 2PD (VDS-2PD) technique' from this point on. A description of the reconstruction algorithms of VDS-3PD/2PD techniques follows.

In both the VDS-3PD and VDS-2PD techniques, a frequency field map is derived from only low spatial frequency data using the spiral 3PD and 2PD algorithms, respectively. Water-fat decomposition and k-space data demodulation are performed for the low spatial frequency data based on the frequencies indicated in the frequency field map. High spatial frequency data are also demodulated with the demodulation frequency indicated in the frequency field map and will be added to the demodulated low spatial frequency data.

In the VDS-3PD technique, the high frequency data of three different TE's (they are defined as $Sh_0$, $Sh_1$ and $Sh_2$) are combined so that their phases are consistent with one another. In other words, when the demodulation frequency is $f_l$ (Hz), the high spatial frequency data of the three TE's to be added to the water image, are combined as (it is defined as Shw):

$$Shw = Sh_0 + Sh_1 \exp(-i2\pi f_l \Delta TE) + Sh_2 \exp(-i2\pi f_l 2\Delta TE), \quad [20]$$

and those that will be added to the fat image are combined as (it is defined as Shf):

$$Shf = Sh_0 + Sh_1 \exp(-i2\pi(f_l + f_{fat})\Delta TE) + Sh_2 \exp(-i2\pi(f_l + f_{fat}) \cdot 2\Delta TE). \quad [21]$$

Similarly, in the VDS-2PD technique, the high frequency data of two TE's ($Sh_0$ and $Sh_1$) to be added to the water image are combined as:

$$Shw = Sh_0 + Sh_1 \exp(-i2\pi f_l \tau), \quad [22]$$

and those to be added to the fat image are combined as:

$$Shf = Sh_0 - Sh_1 \exp(-i2\pi f_l \tau). \quad [23]$$

In both VDS-3PD/2PD techniques, Shw and Shf are demodulated with the demodulation frequencies $f_l$ and $f_l + f_{fat}$, respectively. These demodulated high frequency data are added to the low frequency water and fat images that are already demodulated by the same frequencies $f_l$ and $f_l + f_{fat}$, respectively. As described above, $f_{fat}$ can be referred to as $f_{shift}$ or $f_s$ for applicable chemical species other than fat.

Both the spiral 3PD and 2PD techniques were implemented for in-vivo imaging experiments. All experiments were performed using a 1.5-Tesla Siemens Sonata scanner (Siemens Medical Solutions, Erlangen, Germany). In these experiments, axial brain and pelvis images were acquired from a healthy volunteer using a quadrature head coil and four-element phased array surface coils, respectively. All procedures were done under an institutional review board approved protocol for volunteer scanning.

The following sequence parameters were the same for all the spiral sequences used in the experiments: for the brain image experiments, there were 20 spiral interleaves, FOV 240×240 mm, slice thickness 10 mm, flip angle 13°, spiral readout time 16 ms, and TR 25 ms. For the pelvis imaging experiments, there were 20 spiral interleaves, FOV 390×390 mm slice thickness 10 mm, flip angle 13°, spiral readout time 15 ms, and TR 25 ms.

For the spiral 3PD technique, TE's were set to 3.0(1st)/ 4.5(2nd)/6.0 ms(3rd) in both the brain and pelvis imaging experiments. $\Delta TE$ was set to 1.5 ms as the maximum SNR is attained when $\phi_{fat} = 120°$, as described in ref. 18.

For the spiral 2PD technique, TE's were set to 2.2(1st)/4.4 ms(2nd) in both the brain and pelvis imaging experiments.

The normal spiral sequences with SPSP pulses were also implemented for comparison. 1-4-6-4-1 binomial pulses were used for excitation. The total flip angle for on-resonance spins was 16°. Two acquisitions were performed for off-resonance correction. TR was 33 ms and TE's were set to 6.0/7.5(ms) in both the brain and pelvis imaging experiments.

The VDS-3PD technique was implemented for the axial pelvis image. The image was scanned from the same volunteer using four-element surface coils. The sequence parameters were: 18 interleaved spirals, TE 3.0/4.5/6.0 ms (each TE was shared by 6 interleaves), TR 25 ms, flip angle 13°, FOV 390 mm×390 mm, slice thickness 10 mm, and the radius of the over-sampled region was 40% of $k_{max}$.

For reconstruction of the brain images, k-space data re-gridding was performed to a Cartesian grid. The modified Block Uniform Resampling (BURS) algorithm was used for k-space re-gridding. For reconstruction of the pelvis images, the matrix rescaling algorithm (the equivalent algorithm was also proposed as 'next-neighbor re-gridding') was used to facilitate reconstruction of the multiple k-space data sets. For both water and fat images, the image reconstructed from each coil data was combined using the sum-of-squared method.

The predetermined demodulation frequencies are ranged from −200 Hz to +200 Hz with the frequency resolution 10 Hz (i.e., 41 demodulation frequencies in total) in all image reconstructions. The window sizes to compute $D_{local}$ were set to 9×9 pixels and 5×5 pixels for the brain and pelvis image reconstructions, respectively. The window sizes to compute $P_{local}$ were set to 9×9 pixels and 5×5 pixels for the brain and pelvis image reconstructions, respectively.

Both spiral 3PD and 2PD techniques successfully perform off-resonance correction with water-fat signal decomposition. As mentioned, one of the main advantages of the Dixon technique is that uniform fat suppression can be achieved across an FOV in the presence of $B_0$ inhomogeneity. Both the spiral 3PD and 2PD techniques lead not only to uniform fat suppression but they avoid unwanted water signal suppression when $B_0$ inhomogeneity exists.

Undesirable water signal suppression could be reduced by the use of SPSP pulses with a sharper transition band between the water and fat frequencies. However, such SPSP pulses usually take a relatively long time for excitation. As mentioned, the time duration of SPSP pulses is sometimes equivalent to or may be longer than the spiral readout time. Therefore, the minimum possible TE and TR are determined by the lengths of the SPSP pulses. On the other hand, since normal small flip angle RF pulses are used and hence short TE's can be set in both the spiral 3PD and 2PD techniques, these techniques can provide a way to reduce the scan time in spiral imaging.

A five-pulse binomial scheme was used for spatial-spectral excitation in experiments. It was about 9 ms in duration. The length of a SPSP pulse in other previous studies using spiral trajectories was about 16 ms. The spiral 3PD and 2PD techniques employ normal small flip angle RF pulses and the excitation usually takes only 2–3 ms for each TR. If short TE's (2~4 ms) are used in the newly proposed techniques, TR can be possibly reduced by approximately 10 ms from the spiral acquisitions with SPSP pulses. For example, total acquisition time may be reduced by about 200 ms (or almost half) in 20 interleaved spiral trajectories. The newly proposed techniques can be used to improve temporal resolution in some applications of spiral imaging, such as BOLD imaging and dynamic breast imaging.

As the spiral 2PD technique achieves almost the same performance as the spiral 3PD technique, it is suggested that the spiral 2PD technique be used if a shorter total acquisition time is required. However, in addition to better image SNR, the spiral 3PD technique has a couple of advantages over the spiral 2PD technique. When a frequency field map is determined, no Fast Fourier Transform (FFT) needs to be performed in the spiral 3PD technique; this can be understood from Eq. [9]. On the other hand, a number of FFTs are required in the spiral 2PD technique. Specifically, at each predetermined demodulation frequency $f_j$, two FFTs (to demodulate $W_j'$ and $F_j'$) are needed and hence the total number of FFT required is twice the total number of predetermined frequencies. As mentioned, some of these FFTs may be unnecessary to reconstruct the final deblurred images W and F. Hence, the spiral 3PD technique is computationally more efficient than the spiral 2PD technique since the FFT is the most computationally intensive part in our algorithm. Another advantage of the spiral 3PD technique over the spiral 2PD technique is that the initial frequency field map can be determined without manual seed point selection when the frequency field map is determined using the region growing algorithm. As explained above, the initial frequency field map consists of the pixels of which $D_{local}$-$f_j$ plots have single minimum. Alternately, the spiral 2PD technique needs manual seed point selection to start the region growing algorithm when a frequency field map is determined as is also the case with the rectilinear 2PD technique.

VDS Dixon Techniques

In the conventional spiral acquisition method with SPSP pulses, two data sets with different TE's usually need to be acquired to correct for off-resonance blurring artifacts. The necessity of two data sets diminishes the advantage of spiral imaging as a fast acquisition method. When non-negligible motion is involved between the first scan and the subsequent scan, the off-resonance correction algorithm may fail in spiral imaging because of motion-dependent misregistration between the two images. Similarly, accurate water-fat decomposition may not be achieved in the Dixon technique if there is motion-dependent misregistration among the reconstructed images with different TE's. VDS-3PD/2PD techniques have overcome these drawbacks.

As is evident in the algorithms of VDS-3PD/2PD techniques described above, since high frequency data can not be separated into water and fat signals, when the combined high frequency data of water Shw (Eqs. [20, 22]) are added to the low resolution water image, fat signals in the high frequency data are also added to the low resolution water image. However, as evident from the difference between Eqs. [20 and 21] and the difference between Eqs. [22 and 23], the phases of fat signals in the high frequency data of different TE's are not consistent with one another when water signals in the high frequency data are phase-consistent. Moreover, when the water image is reconstructed, the fat signals in the high frequency data are demodulated not by their demodulation frequency $f_j+f_{fat}$ but by the demodulation frequency of water signals $f_j$. Therefore, the high frequency components of the fat signals are smeared out in the water image. As the total signal amounts of the high frequency components are usually quite small compared with those of the low frequency components, the artifacts due to high frequency components of the fat signals are inconsequential in the water image. Similarly, since water signals in the high frequency data are spread out in the fat image, there are usually no apparent artifacts in the fat image caused by the high spatial frequency water signals.

The spiral 3PD and 2PD techniques proposed here can achieve not only water-fat signal decomposition but also off-resonance blurring artifact correction. The SPSP pulses commonly used in spiral imaging may not lead to uniform fat suppression and they may also yield undesirable water signal suppression in the presence of $B_0$ inhomogeneity. Furthermore, they usually require a long time for excitation. These disadvantages of SPSP pulses can be overcome by the techniques we have proposed which provides excellent performance as well as reduced acquisition time. Although they require additional computational costs to the conventional spiral off-resonance correction method, faster data acquisition is possible than in conventional spiral acquisitions that use SPSP pulses. One-acquisition spiral Dixon techniques using variable density spiral trajectories have also been shown to be simple extensions of the spiral 3PD and 2PD techniques, thereby avoiding the need for multiple separate acquisitions. The spiral Dixon techniques proposed here offer new and alternative approaches to achieve effective fat signal suppression with reduced scan time.

What is claimed is:

1. A method of chemical species suppression for MRI imaging of a scanned object region comprising:
    acquiring K space data using a spiral acquisition technique for at least a first TE and at least a second TE which is different, for purposes of performing at least two-point Dixon processing;
    reconstructing at least two sets of image data having off resonance effects;
    estimating the off resonance effects at locations throughout the at least two reconstructed sets of image data;
    decomposing said at least two sets of reconstructed image data into at least first and second chemical species image data sets each representing a separate chemical species; and
    correcting said at least first and second chemical species image data sets for blurring resulting from off resonance effects due to Bo inhomogeneity using said estimated off resonance effects, wherein each of the at least two corrected chemical species image data sets suppresses signals from other chemical species.

2. The method of claim 1 wherein said step of correcting is performed as an integral part of said decomposing step.

3. The method of claim 1 wherein said step of correcting is performed separately from said step of decomposing.

4. The method defined in claim 1 wherein an off resonance correction method is used to eliminate the effects of local $B_0$ inhomogeneity on the first chemical species image data set.

5. The method defined in claim 1 wherein an off resonance correction method is used to eliminate the effects of local $B_0$ inhomogeneity on the second chemical species image data set.

6. The method defined in claim 1 wherein an off resonance correction method to eliminate the effects of local $B_0$ inhomogeneity is used on the first chemical species and the second chemical species image data sets.

7. The method defined in claim 1 wherein the first chemical species is water and the second chemical species is fat.

8. The method defined in claim 1 further comprising using more than one coil for obtaining the data sets using a weighted average from signals of each coil when a minimum local difference between acquired signals and estimated signals is $D_{pixel} = |S_0-(W'_j+F'_j)|+|S_1-(W'_j+F'_j\exp(i\phi f_s))\exp(i\phi_j)|+|S_2-(W'_j+F'_j\exp(i2\phi f_s))\exp(i2\phi_j)|$.

9. The method defined in claim 1 further comprising acquiring a plurality of interleaves, wherein each interleave uses a different TE and the sampling density of each interleave is sufficient to create a low resolution image data set.

10. The method defined in claim 9 wherein the sampling density of each component sufficiently over-samples k space to create a low-resolution image data set of the object at that TE.

11. The method defined in claim 1 wherein the step of acquiring K space data at the first TE and the second TE comprises acquiring signal components from the first and second chemical species.

12. The method defined in claim 1 further comprising acquiring K space data at a third TE, which is different from said first and second TE.

13. The method defined in claim 12 wherein the step of acquiring K space data at the third TE comprises acquiring signal components from the first and second chemical species.

14. The method defined in claim 1 wherein the step of estimating the off resonance effects comprises generating an estimated frequency field map.

15. The method defined in claim 14 wherein the step of generating an estimated frequency field map comprises:
   a. estimating the off resonance effects for a first location comprising:
      i. providing a frequency,
      ii. estimating signal components for first and second chemical species at the provided frequency,
      iii. calculating an estimated signal of the first and second chemical species at the provided frequency,
      iv. calculating the difference between the estimated and acquired signal at the provided frequency, and
      v. repeating steps i.–iv. for different frequencies to find the frequency that minimizes the difference for the first location; and
   b. repeating steps i.–v. for other locations in the estimated frequency field map.

16. The method defined in claim 15 further comprising using region growing to create the estimated frequency field map for the scanned object.

17. The method defined in claim 16 further comprising determining a frequency determined region as the value of $f_j$ that minimizes $D_{local}$ where $D_{local}$ takes the single minimum in the $D_{local}$–$f_j$ plot.

18. The method defined in claim 16 further comprising expanding the frequency determined region so that the estimated frequency field map can be created for the scanned object region.

19. The method defined in claim 18 further comprising finding the correct frequency $f_j$ at each pixel in a 'frequency to-be-determined region', which abuts the 'frequency determined' region.

20. The method defined in claim 19 wherein the step of finding the correct frequency $f_j$ comprises choosing the value of $f_j$ at each pixel that borders the frequency determined region which creates a local minima in the $(D_{local}-f_j)$ plot, and is the closest to an average local frequency of the neighboring pixels in the frequency determined region.

21. The method defined in claim 14 wherein the step of generating an estimated frequency field map comprises:
   a. estimating the off resonance effects for a first location comprising:
      i. providing a frequency,
      ii. estimating signal components for the first and second chemical species at the provided frequency,
      iii. determining whether the signal components have the same or opposite phases at the provided frequency, and
      iv. repeating i.–iii. for another frequency if the signal components do not have the same or opposite phases; and
   b. repeating steps i.–iv. for other locations in the estimated frequency field map.

22. The method defined in claim 14 wherein the first and second chemical species image data sets are corrected based on the frequencies indicated in the estimated frequency field map at each pixel location having blurring due to the off resonance effects of local $B_0$ inhomogeneity.

23. The method defined in claim 22 wherein said correcting comprises demodulating the first and second chemical species image data sets with demodulation frequencies $f_1$ and $f_1+f_s$ to create locally deblurred image data sets of the first and second chemical species respectively.

24. The method defined in claim 23 wherein said correcting comprises reconstructing the entirely deblurred first chemical species image data set by combining the deblurred regions of the first chemical species image data set from each local frequency, $f_1$, in the estimated frequency field map.

25. The method defined in claim 23 wherein said correcting comprises reconstructing the entirely deblurred second chemical species image data set by combining the deblurred regions of the second chemical species image data set from each local frequency, $f_s$, in the frequency field map.

26. A method to separate fat and water signals in MRI imaging of a scanned object region, said method comprising:
   acquiring at least two sets of K-space data via spiral scanning before image reconstruction, wherein each said set of K-space data is acquired using a different TE from that of any other said set of K-space data, for purposes of performing at least two-point Dixon processing;
   generating a frequency field map from said at least two sets of K-space data;
   performing water-fat decomposition using said at least two sets of K-space data to reconstruct a blurred water image and a blurred fat image; and
   applying said frequency field map to said blurred water image and said blurred fat image to form a deblurred water image and a deblurred fat image.

* * * * *